(12) United States Patent
Fredriksson et al.

(10) Patent No.: US 11,581,895 B2
(45) Date of Patent: Feb. 14, 2023

(54) ANALOG-TO-DIGITAL CONVERTER CIRCUIT

(71) Applicant: Telefonaktiebolaget LM Ericsson (publ), Stockholm (SE)

(72) Inventors: Henrik Fredriksson, Lund (SE); Henrik Sjöland, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 35 days.

(21) Appl. No.: 17/431,888

(22) PCT Filed: Feb. 27, 2019

(86) PCT No.: PCT/EP2019/054855
§ 371 (c)(1),
(2) Date: Aug. 18, 2021

(87) PCT Pub. No.: WO2020/173558
PCT Pub. Date: Sep. 3, 2020

(65) Prior Publication Data
US 2022/0140835 A1    May 5, 2022

(51) Int. Cl.
*H03M 1/12* (2006.01)
*H03M 1/04* (2006.01)
(Continued)

(52) U.S. Cl.
CPC ............... *H03M 1/04* (2013.01); *H03M 1/06* (2013.01); *H03M 1/1023* (2013.01);
(Continued)

(58) Field of Classification Search
CPC .... H03M 1/04; H03M 1/1023; H03M 1/1245; H03M 1/361; H03M 1/06
See application file for complete search history.

(56) References Cited

U.S. PATENT DOCUMENTS 7,420,494 B1    9/2008   Schreier
9,571,115 B1 *  2/2017   Beukema ............ H03M 1/1023
(Continued)

OTHER PUBLICATIONS

Jeon, M., et al., "A Stochastic Flash Analog-to-Digital Converter Linearized by Reference Swapping", IEEE Access, Oct. 26, 2017, pp. 23046-23051, vol. 5.
(Continued)

*Primary Examiner* — Joseph J Lauture
(74) *Attorney, Agent, or Firm* — Coats & Bennett, PLLC

(57) ABSTRACT

An ADC circuit (50) is disclosed. It comprises a global input configured to receive an input voltage ($V_{in}$) and a plurality of converter circuits ($105_1$-$105_N$). Each converter circuit ($105_j$) comprises a comparator circuit ($70_j$) having a first input connected to the global input, a second input, and an output configured to output a one-bit output signal of the comparator circuit ($70_j$). Furthermore, each converter circuit ($105_j$) comprises a one-bit current-output DAC ($110_j$) having an input directly controlled from the output of the comparator circuit ($70_j$) and an output connected to the second input of the comparator circuit ($70_j$). The second inputs of all comparator circuits are interconnected. The ADC circuit (50) further comprises a digital output circuit (130) configured to generate an output signal z[n] of the ADC circuit (50) in response to the one-bit output signals of the comparator circuits ($70_j$).

20 Claims, 5 Drawing Sheets

(51) Int. Cl.
    *H03M 3/00* (2006.01)
    *H03M 1/10* (2006.01)
    *H03M 1/36* (2006.01)
    *H03M 1/06* (2006.01)

(52) U.S. Cl.
    CPC .......... *H03M 1/1245* (2013.01); *H03M 1/361* (2013.01); *H03M 3/30* (2013.01)

(56) References Cited

U.S. PATENT DOCUMENTS

| | | |
|---|---|---|
| 9,825,645 B1 | 11/2017 | Gaggl et al. |
| 2008/0068245 A1 | 3/2008 | Kuramochi et al. |

OTHER PUBLICATIONS

Verbruggen, B., et al., "A 60 dB SNDR 35 MS/s SAR ADC With Comparator-Noise-Based Stochastic Residue Estimation", IEEE Journal of Solid-State Circuits, Sep. 1, 2015, pp. 2002-2011, vol. 50, No. 9.

Sundström, T., et al., "Utilizing Process Variations for Reference Generation in a Flash ADC", IEEE Transactions on Circuits and Systems-II: Express Briefs, May 1, 2009, pp. 364-368, vol. 56, No. 5.

Weaver, S., et al., "Stochastic Flash Analog-to-Digital Conversion", IEEE Transactions on Circuits and Systems-I: Regular Papers, Nov. 1, 2010, pp. 2825-2833, vol. 57, No. 11.

Xiao, B., et al., "Power Optimized Comparator Selecting Method Form Stochastic ADC", IEEE International Symposium on Circuits and Systems (ISCAS), May 1, 2018, pp. 1-4.

Zhang, Y., et al., "Efficient technique for excess loop delay compensation in continuous-time $\Delta\Sigma$ modulators", Electronics Letters, Nov. 21, 2013, pp. 1522-1523, vol. 49, No. 24.

Daly, D., "A 6-bit, 0.2 V to 0.9 V Highly Digital Flash ADC With Comparator Redundancy", IEEE Journal of Solid-State Circuits, Nov. 1, 2009, pp. 3030-3038, vol. 44, No. 11.

Sugimoto, T., et al., "Comparator Design for Linearized Statistical Flash A-to-D Converter", Proceedings of the 24th International Conference 'Mixed Design of Integrated Circuits and Systems', Jun. 22-24, 2017, pp. 84-89, Bydgoszcz, Poland.

Hirai, Y., et al., "A Delta-Sigma ADC with Stochastic Quantization", IPSJ Transactions on System LSI Design Methodology, Information Processing Society of Japan, Aug. 1, 2015, pp. 123-130, vol. 8.

\* cited by examiner

ANALOG-TO-DIGITAL CONVERTER CIRCUIT

TECHNICAL FIELD

The present invention relates to analog-to-digital conversion.

BACKGROUND

There is a trend in wireless transceivers for 5G (5th generation cellular networks) and other standards to use ever higher bandwidth, posing stringent requirements on the analog to digital converters (ADCs). One way of achieving high speed is using flash-ADCs. It uses one separate comparator per digital level of the signal, i.e. $2^N-1$ comparators, where N is the number of bits. By performing $2^N-1$ parallel comparisons, the N-bit analog to digital conversion can be completed in a single clock cycle. The accuracy requirement in terms of noise and offset in each comparator also increases exponentially with N. Although fast, it is therefore typically difficult to achieve sufficient resolution for wireless systems, and the power consumption is often high. To ensure efficient use of the $2^N-1$ comparators implemented, the noise (and offset) levels are designed to be significantly lower than the quantization noise, i.e. such a flash ADC is normally not thermal noise limited. Another issue is the high input capacitance, posing stringent requirements on buffers. Although newer semiconductor technologies offer higher speed, the supply voltage to offset and noise ratio is degraded, which is a drawback to high resolution flash-ADCs.

One way of achieving higher resolution is to use delta-sigma modulators. The increase of resolution, however, comes at the cost of reduced speed, so for very high speed the additional resolution that can be achieved is limited. A combination of a fast and medium resolution flash-ADC and delta sigma modulation can then be attractive. However, all delays in the loop must be kept short to avoid stability issues.

To address the problem of comparator offsets in flash-ADCs, and even turn it into something useful, statistical (or "stochastic") flash-ADCs can be used. A larger number of relatively small comparator circuits are then used, with the same reference level, and the number of comparators with high logic level outputs are counted to find the digital output. With a Gaussian distribution of comparator circuit offset and noise, the ADC gets a corresponding transfer, i.e. a Gaussian one. To address the non-linearity of the Gaussian function, a calibration with selection of comparator circuits with uniformly distributed offsets can be performed, which is e.g. described in T. Sundström, A. Alvandpour, "Utilizing Process Variations for Reference Generation in a Flash ADC", *IEEE Transactions on Circuits and Systems—II*, Vol. 56, No. 5, pp. 364-368, May 2009. Another way is to cascade the statistical flash-ADC with the inverse non-linearity in a post-distortion arrangement, which is e.g. disclosed in B. Verbruggen et. Al., "A 60 dB SNDR 35 MS/s SAR ADC with Comparator-Noise-Based Stochastic Residue Estimation", *IEEE Journal of Solid-State Circuit*, Vol. 50, No. 9, pp. 2002-2011, September 2015.

Hirai et al, "A Delta-Sigma ADC with Stochastic Quantization", *IPSJ (Information Processing Society of Japan) Transactions on System LSI Design Methodology*, vol. 8, pp. 123-130, August 2015, considers application of stochastic analog-to-digital conversion to multi-bit delta-sigma modulators. A resistive reference ladder is used to coarsely determine quantization levels, whereas digitally controlled comparators implemented using stochastic flash ADCs finely determine the quantization levels.

SUMMARY

The inventors have developed a feedback technique where, for each comparator circuit, a digital-to-analog converter (DAC) circuit is directly controlled from the comparator circuit's output and has its output connected to an input of the comparator circuit. This technique can provide linearization with relatively wide bandwidth.

According to a first aspect, an analog-to-digital converter (ADC) circuit is provided. It comprises a global input configured to receive an input voltage and a plurality of converter circuits. Each converter circuit comprises a comparator circuit having a first input connected to the global input, a second input, and an output configured to output a one-bit output signal of the comparator circuit. Furthermore, each converter circuit comprises a one-bit current-output digital-to-analog converter (DAC) having an input directly controlled from the output of the comparator circuit and an output connected to the second input of the comparator circuit. The second inputs of all comparator circuits are interconnected. The ADC circuit further comprises a digital output circuit configured to generate an output signal z[n] of the ADC circuit in response to the one-bit output signals of the comparator circuits.

The ADC circuit may comprise a capacitor circuit connected to the interconnected second inputs of the comparator circuits.

The second inputs of the comparator circuits may be formed by gate terminals of field-effect transistors.

The comparator circuit may be a clocked comparator circuit configured to update the output signal of the comparator circuit periodically in response to a clock signal.

The digital output circuit may comprise a digital summation circuit configured to generate a sum signal y[n] as a sum of the one-bit output signals from the comparator circuits. The digital output circuit may comprise a filter circuit configured to generate a filtered sum signal $\hat{v}[n]$ by filtering the sum signal y[n]. The filter circuit may be an accumulator.

In some embodiments, the filtered sum signal $\hat{v}[n]$ is the output signal z[n] of the ADC circuit.

The digital output circuit may comprise a mapping circuit configured to generate a mapped sum signal ê[n] in response to the sum signal y[n] as ê[n]=cdf$^{-1}$(y[n+1]), where cdf$^{-1}$(•) in an inverse of a monotone nonlinear mapping cdf(•).

In some embodiments, a sum of the mapped sum signal ê[n] and the filtered sum signal $\hat{v}[n]$ is the output signal z[n] of the ADC circuit.

According to a second aspect, there is provided an integrated circuit comprising the ADC circuit of the first aspect.

According to a third aspect, there is provided an electronic apparatus comprising the ADC circuit of the first aspect. The electronic apparatus may, for instance, be a communication apparatus, such as (but not limited to) a wireless communication device or a base station for a cellular communications system.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

DETAILED DESCRIPTION

Figure 1:
FIG. 1 illustrates a communication environment.

FIG. 1 illustrates a communication environment wherein embodiments of the present invention may be employed. A wireless communication device 1, or wireless device 1 for short, of a cellular communications system is in wireless communication with a radio base station 2 of the cellular communications system. The wireless device 1 may be what is generally referred to as a user equipment (UE). The wireless devices 1 is depicted in FIG. 1 as a mobile phone, but may be any kind of device with cellular communication capabilities, such as a tablet or laptop computer, machine-type communication (MTC) device, or similar. Furthermore, a cellular communications system is used as an example throughout this disclosure. However, embodiments of the present invention may be applicable in other types of systems as well, such as but not limited to WiFi systems.

The radio base station 2 and wireless device 1 are examples of what in this disclosure is generically referred to as communication apparatuses. Embodiments are described below in the context of a communication apparatus in the form of the radio base station 2 or wireless device 1. However, other types of communication apparatuses can be considered as well, such as a WiFi access point or WiFi enabled device.

Figure 2:
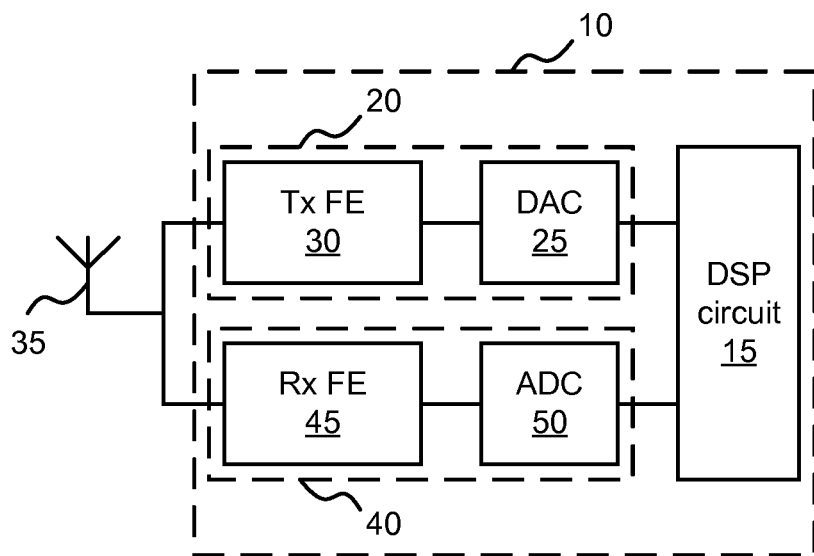
FIG. 2 is a block diagram of a transceiver circuit.

FIG. 2 is a block diagram of an embodiment of a transceiver circuit 10, which can be comprised in a communication apparatus, such as the radio base station 2 or the wireless device 1. In the embodiment illustrated in FIG. 2, the transceiver circuit 10 comprises a digital signal processing (DSP) circuit 15. The DSP circuit 15 may e.g. be what is commonly referred to as baseband processor. The DSP circuit 15 may e.g. be configured to perform various digital signal processing tasks, such as one or more of coding, decoding, modulation, demodulation, fast Fourier transform (FFT), inverse FFT (IFFT), mapping, demapping, etc.

Furthermore, in the embodiment illustrated in FIG. 2, the transceiver circuit 10 comprises a transmitter circuit 20. The transmitter circuit 20 comprises a digital-to-analog converter (DAC) circuit 25. The DAC circuit 25 is connected to the DSP circuit 15 and configured to receive, as an input signal of the DAC circuit 25, a digital representation of a signal to be transmitted from the DSP circuit 15. The DAC circuit 25 is further configured to convert the signal to be transmitted to an analog representation, which is an output signal of the DAC circuit 25. The transmitter circuit 20 also comprises a transmitter (Tx) frontend (FE) circuit 30 connected between the DAC circuit 25 and an antenna 35. The Tx FE circuit 30 is configured to transform the output signal from the DAC circuit 25 to a format suitable for transmission via the antenna 35. This may include operations such as frequency upconversion, filtering, and/or amplification. The Tx FE circuit 30 may comprise one or more mixers, filters, and/or amplifiers, such as power amplifiers (PAs), to perform such operations. The design of such Tx FE circuits is, per se, well known to a person skilled in the field of radio transceiver design, and is not discussed herein in any further detail.

Moreover, in the embodiment illustrated in FIG. 2, the transceiver circuit 10 comprises a receiver circuit 40. The receiver circuit 40 comprises a receiver (Rx) FE circuit 45 connected to the antenna 35. Furthermore, the receiver circuit 40 comprises an ADC circuit 50. The ADC circuit 50 is connected between the Rx FE circuit 45 and the DSP circuit 15. The Rx FE circuit 45 is configured to transform a signal received via the antenna 35 to a format suitable to be input to the ADC circuit 50. This may include operations such as frequency downconversion, filtering, and/or amplification. The Rx FE circuit 45 may comprise one or more mixers, filters, and/or amplifiers, such as low-noise amplifiers (LNAs), to perform such operations. The design of such Rx FE circuits is, per se, well known to a person skilled in the field of radio transceiver design and is not discussed herein in any further detail. The ADC circuit 50 is configured to receive its (analog) input signal from the Rx FE circuit and convert it to a digital representation to generate the digital output signal of the ADC circuit 50. This digital output signal of the ADC circuit 50 is input to the DSP circuit 15 for further digital signal processing.

Figure 3:
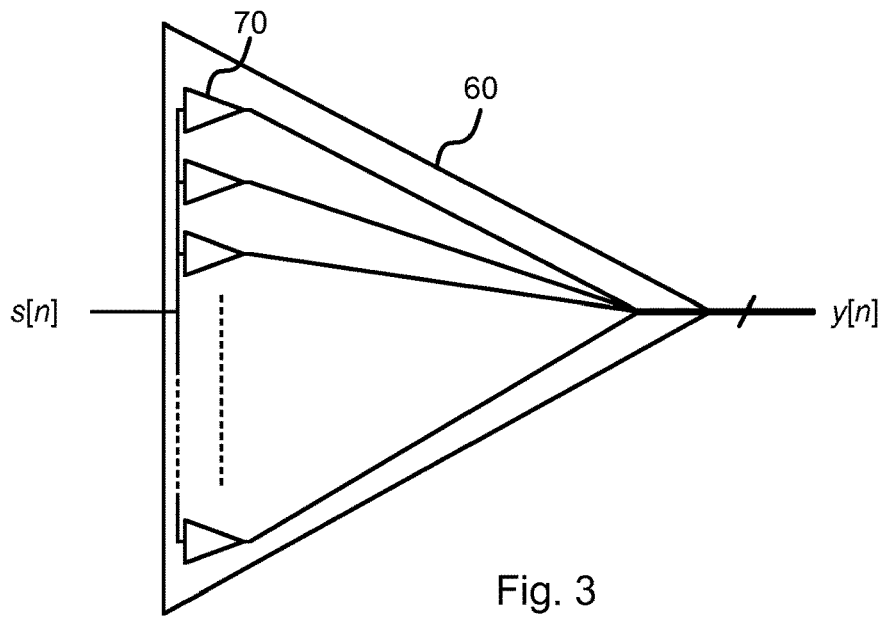
FIG. 3 illustrates a statistical flash ADC.

FIG. 3 illustrates a statistical flash ADC 60. The discrete-time analog input signal is denoted s[n], where n is an integer sequence index pointing out a particular sample. The statistical flash ADC 60 comprises a plurality of parallel comparators, collectively referred to with the reference number 70. For the sake of illustration, it is assumed that the output of such a comparator is '1' when the input signal level exceeds a threshold, and '0' otherwise, but it may well be the other way around in some implementations. Due to, e.g., manufacturing inaccuracies, there is a spread in input offsets of the comparators 70, i.e. they have different input offsets. Another factor that causes the comparators 70 to behave mutually different is noise. The noise can be considered to provide a time-varying component to the input offset of individual comparators 70. Normally, relatively low noise is desired in comparators.

However, in a statistical flash ADC, noise is actually desired as it contributes a desired statistical spread, further discussed below. This means that the noise constraints when designing the comparators 70 is significantly relaxed compared with regular comparator design.

The input offsets of the comparators 70 are referred to in the following simply as "the offsets". Another way of viewing this is that the comparators 70 have different threshold levels. Typically, the offsets, both due to manufacturing inaccuracies and due to noise, will have a Gaussian, or close to Gaussian, distribution. This statistical spread in offset is utilized to provide analog-to-digital conversion. With increasing value of the input signal s[n], the number of comparators outputting a '1' also increases. Hence, the number of comparators outputting a '1' is a digital representation of the value of the analog input signal s[n]. It should be noted that if there was no spread in offset, the comparators would all transition from '1' to '0', and vice versa, at the same threshold, and would provide no additional information on the value of the input signal s[n] than a single comparator. An output signal y[n] is formed by the one-bit outputs of the comparators 70. In the following description, y[n] is considered to be a number equal to the number of comparators 70 whose output is '1'. In FIG. 3, the output signal y[n] is represented with a digital word, each bit of which corresponds to the output of one of the comparators 70. However, in some implementations, other number representations may be used. For instance, the output signal y[n] may be represented as a binary number (base 2) by including a circuit that counts the number of comparator outputs that are '1' and outputs the result in a binary number representation. Representations in other number systems may be accomplished in a similar manner.

Figure 4:
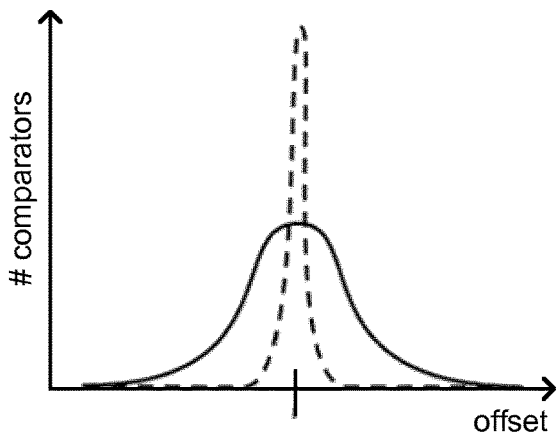
FIG. 4 shows plots of distribution functions.

FIG. 4 shows plots of distribution functions for the offsets. If the comparators are well matched, the distribution function of the offset will have a relatively narrow peak, as illustrated with the dashed plot of an offset distribution function in FIG. 4. This corresponds to a relatively small useful input range for the statistical flash ADC 60. To obtain a wider input range, comparators with worse matching of the offsets should be used, e.g. as illustrated with the solid plot of an offset distribution function in FIG. 4. Poor matching can e.g. be obtained by implementing the comparators with transistors having a small physical feature size (small channel length and channel with), for instance using the smallest possible transistor sizes of a given manufacturing technology.

Figure 5:
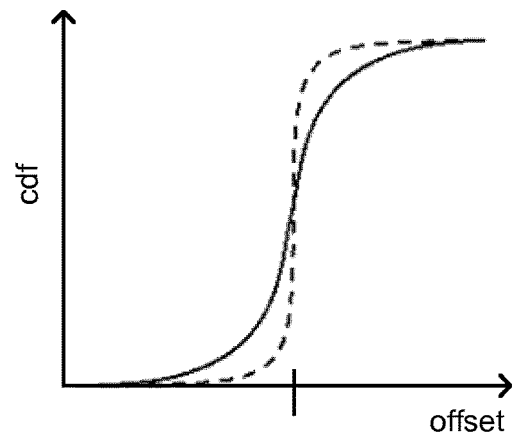
FIG. 5 shows plots of cumulative distribution functions.

FIG. 5 shows plots of cumulative distribution functions (CDFs) corresponding to the distribution functions in FIG. 4. The dashed CDF in FIG. 5 corresponds to the dashed distribution function in FIG. 4, and the solid CDF in FIG. 5 corresponds to the solid distribution function in FIG. 4. The CDF for a given offset value is obtained by integrating the corresponding distribution function from 0 to that offset value. The CDF can be viewed as the transfer characteristic from s[n] to y[n] of the statistical flash ADC 60; the term offset on the x-axis can be replaced with s[n] and the term CDF on the y-axis can be replaced with the number y[n], i.e. the number of bits in the word representing y[n] that is '1'. The solid CDF is less steep than the dashed CDF, which is again an indication of a wider useful input range resulting from a larger spread in offset values.

Figure 6:
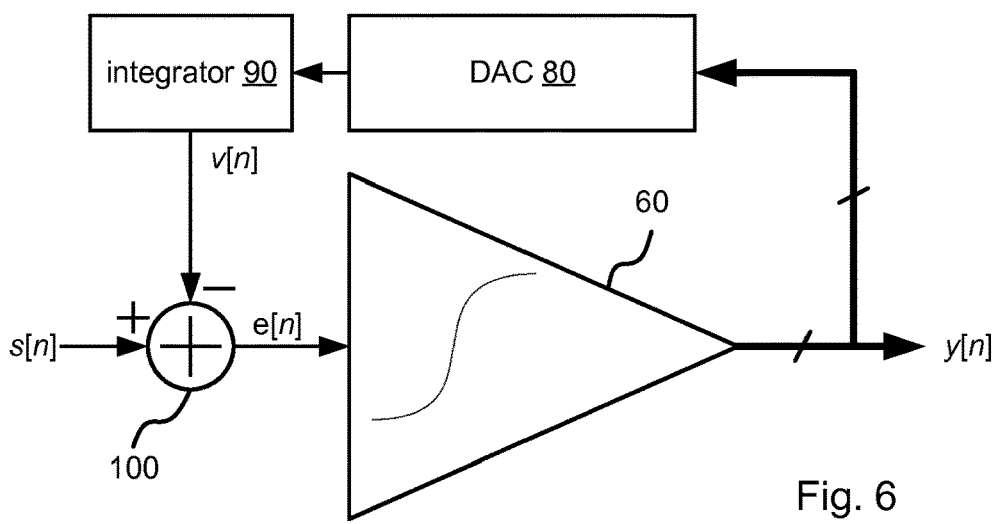
FIG. 6 shows a functional model of embodiments.

FIG. 6 shows a functional model of embodiments disclosed herein. The output y[n] of a statistical flash ADC 60 is applied in a feedback loop via a DAC 80 and a discrete-time integrator (or "accumulator") 90 to provide a feedback signal v[n]. The feedback signal v[n] is subtracted from the analog input signal to generate a difference signal e[n]. The difference signal e[n] is used as an input signal to the statistical flash ADC 60. This arrangement is similar to a first-order delta-sigma modulator and is operative to linearize the transfer characteristic, compared with the circuit shown in FIG. 3 without any feedback loop. The model depicted in FIG. 6 can be described in mathematical terms as follows:

$$s[n]-v[n]=e[n] \quad (1)$$

Assuming that the conversion takes one sampling clock cycle, $$y[n+1]=\text{CDF}(e[n]) \quad (2)$$

where CDF(•) is the cumulative distribution function of the statistical flash ADC. Furthermore, $$v[n]=v[n-1]+k \cdot y[n] \quad (3)$$

where k is a gain of the integrator 90.

Figure 7:
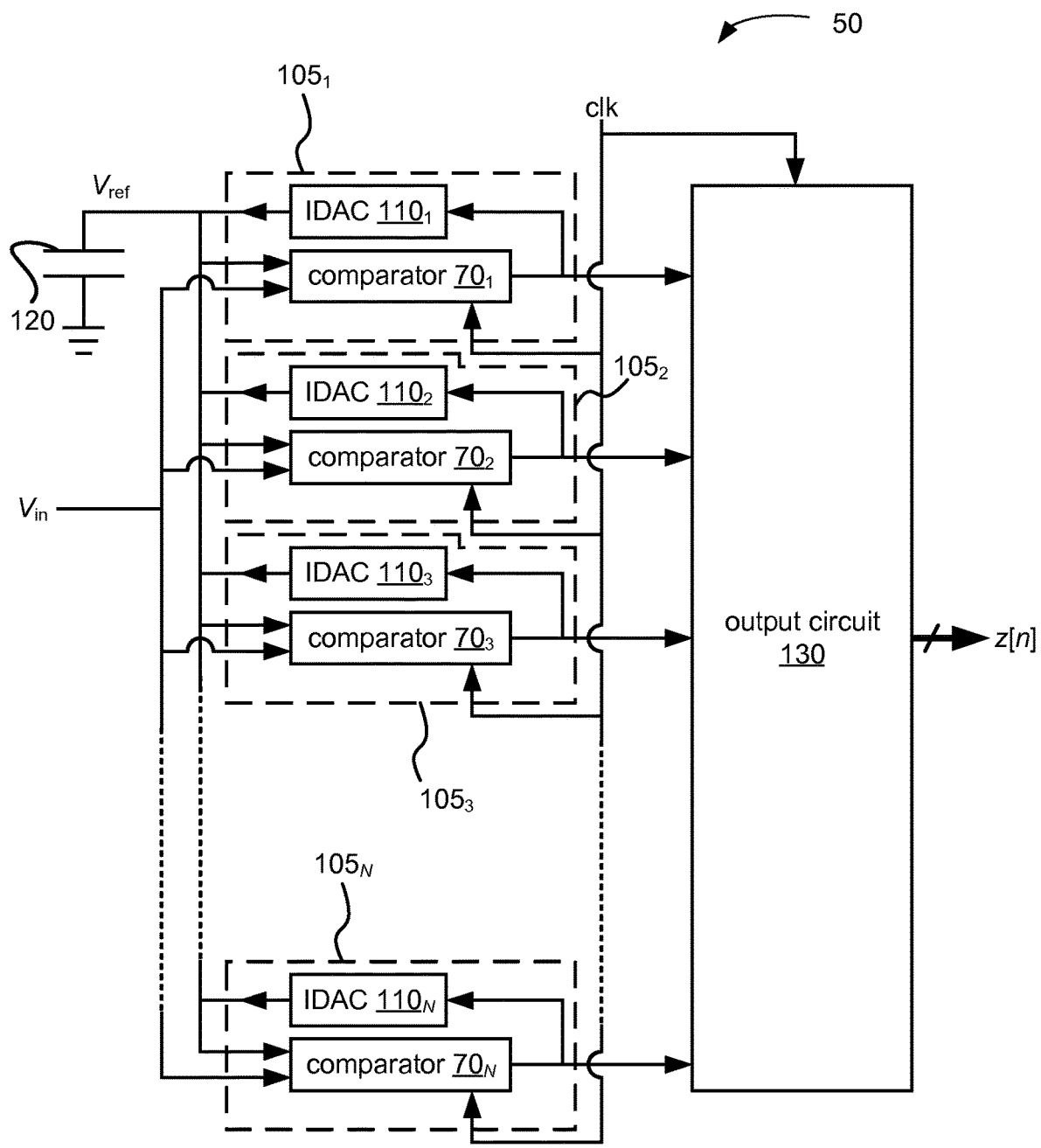
FIG. 7 is a block diagram of an embodiment of an ADC circuit.

FIG. 7 is a block diagram of an embodiment of the ADC circuit 50 which is configured to operate according to the principle described above in connection with FIG. 6. In FIG. 6, the ADC circuit 50 comprises a global input configured to receive an input voltage $V_{in}$. This input voltage $V_{in}$ corresponds to the discrete-time analog input signal s[n] in FIG. 6. Furthermore, the ADC circuit comprises a plurality of converter circuits $105_1$-$105_N$. Each converter circuit $105_j$ comprises a comparator circuit $70_j$ (corresponding to the comparators 70 of FIG. 3) having a first input connected to the global input terminal, a second input, and an output. The output is configured to output a one-bit output signal of the comparator circuit $70_j$. Furthermore, each converter circuit $105_j$ comprises a one-bit current-output DAC (IDAC) $110_j$ having an input directly controlled from the output of the comparator circuit $70_j$ and an output connected to the second input of the comparator circuit $70_j$. The second inputs of all comparator circuits are interconnected. Moreover, the ADC circuit 50 comprises a digital output circuit 130 configured to generate an output signal z[n] of the ADC circuit 50 in response to the one-bit output signals of the comparator circuits $70_j$.

In FIG. 7, the ADC circuit 50 comprises a capacitor circuit 120 connected to the interconnected second inputs of the comparator circuits $70_j$. The capacitor circuit 120 may for instance be implemented as a parallel-plate capacitor between metal regions of an integrated circuit, as a MOS (Metal Oxide Semiconductor) capacitor by shorting the drain and source of a MOSFET (MOS Field Effect Transistor), or in any other way suitable to implement a capacitor in an integrated circuit. The total capacitance $C_{tot}$ at the interconnected second inputs includes both the capacitance of the capacitor circuit 120 and any parasitic capacitance at the interconnected second inputs of the comparator circuits $70_1$-$70_N$.

The output currents from the IDACs $110_1$-$110_N$ are summed, and integrated as an accumulated electrical charge in the capacitance $C_{tot}$ at the interconnected second inputs of the comparator circuits $70_1$-$70_N$, thereby forming a voltage $V_{ref}$ as indicated in FIG. 7. The voltage $V_{ref}$ corresponds to the feedback signal v[n] in FIG. 6. The term $V_{ref}$ is used for this voltage because it is the reference level with which the input voltage $V_{in}$ is compared in the comparators $70_1$-$70_N$. It should be noted, however, that $V_{ref}$ is a time-varying voltage, and not a fixed reference voltage.

The value of the gain k (Eq. (3)) is partly determined by the capacitance $C_{tot}$ mentioned above. In some embodiments, the capacitor circuit 120 is implemented as a variable capacitor, thereby allowing the gain k to be tuned, by means of varying the capacitance of the capacitor circuit 120 and thereby the capacitance $C_{tot}$.

In some embodiment, $C_{tot}$ is provided by the parasitic capacitance at the interconnected second inputs of the comparator circuits $70_1$-$70_N$ only, i.e. the capacitor circuit 120 may be omitted. For instance, the second inputs of the comparator circuits $70j$ may be formed by gate terminals of field-effect transistors (FETs). An example is described below with reference to FIG. 12. In such an embodiment, the capacitance $C_{tot}$ may be provided mainly by the gate capacitances of these FETs, although other parasitics may contribute as well.

As mentioned above, the input of each IDAC $110_j$ is controlled directly from the output of the comparator circuit $70_j$. Hence, there are no additional latches, registers, or arithmetic logic in between the output of the comparator circuit $70_j$ and the input of the IDAC $110_j$. This enables relatively high-speed operation, and thereby enables overall operation of the ADC circuit 50 at relatively high sample rates, which is advantageous.

In some embodiments, the comparator circuits $70_j$ are clocked comparator circuits. In other words, in these embodiments, the output signals of the comparator circuits $70_j$ are updated periodically in response to a clock signal clk, indicated in FIG. 7.

Figure 8:
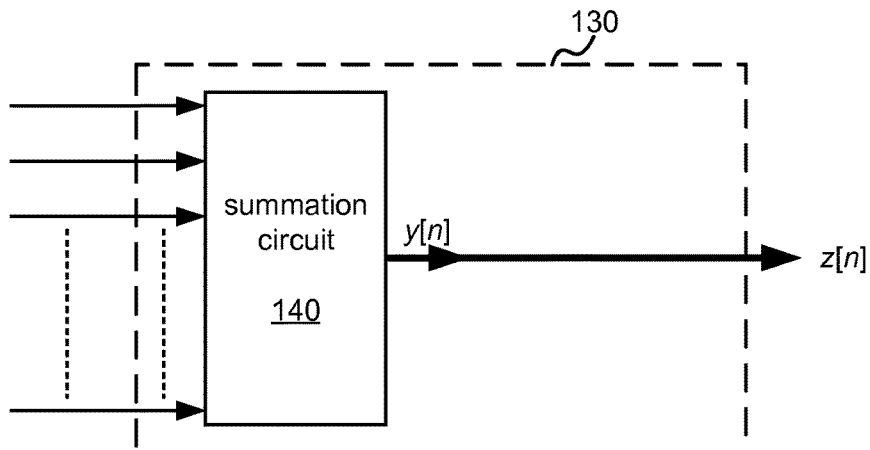
FIGS. 8-9 are block diagrams of embodiments of a digital output circuit.

In some embodiments, the signal y[n] may be used as the output signal z[n]. This is illustrated in FIG. 8, illustrating an embodiment of the digital output circuit 130. In FIG. 8, the digital output circuit 130 comprises a digital summation circuit 140 configured to generate a sum signal as a sum of the one-bit output signals from the comparator circuits $70_j$. This sum signal is equal to the number of comparators $70_j$ whose output is '1', i.e. it is equal to y[n] (which is indicated by denoting the sum signal y[n] in FIG. 8-11), but using another number representation, for instance a binary number representation, than at the outputs of the comparators $70_j$. Hence, the digital summation circuit 140 can be seen as a number representation converter for obtaining a more convenient number representation for y[n].

Figure 9:
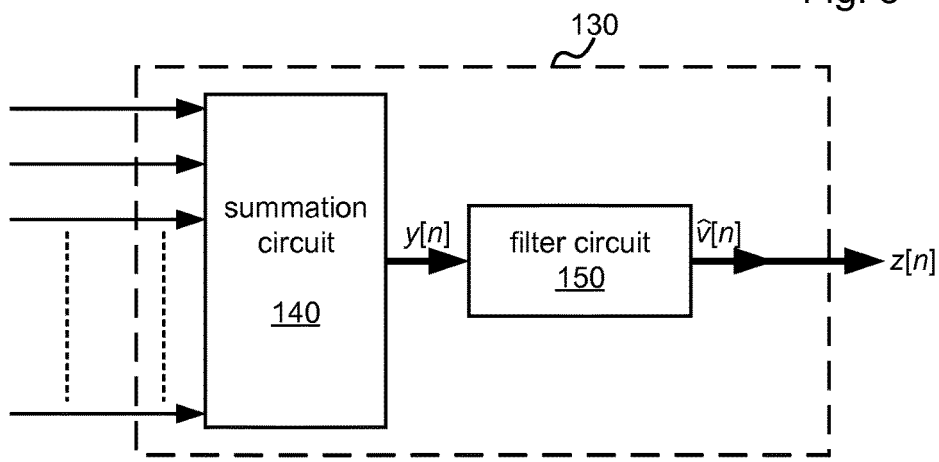

In some embodiments, an estimate of the signal v[n] (FIG. 6) is used as the output signal z[n]. In the following, this estimate is denoted $\hat{v}[n]$. In some embodiments, $\hat{v}[n]$ is obtained by filtering the sum signal y[n]. Hence, $\hat{v}[n]$ is referred to below as "the filtered sum signal". Hence, in some embodiments, the digital output circuit 130 comprises a filter circuit 150 configured to generate the filtered sum signal $\hat{v}[n]$ by filtering the sum signal y[n], as illustrated in FIG. 9.

Figure 10:
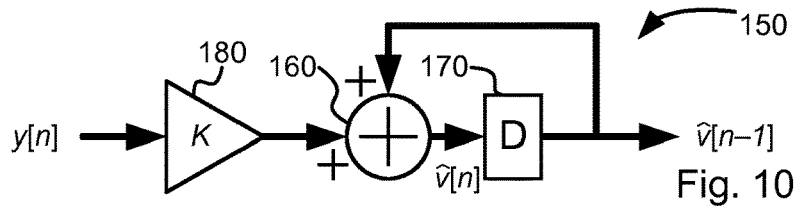
FIG. 10 is a block diagram of an embodiment of a filter circuit.

In some embodiments, the filter circuit 150 is an accumulator. An example of this is illustrated in FIG. 10. In FIG. 10, the accumulator comprises an adder circuit 160 and a delay element 170 connected to the output of the adder circuit 160. The output of the delay element 170 is fed back to an input of the adder circuit 160. The other input of the adder circuit 160 is supplied with an output signal from a coefficient multiplier circuit 180, configured to multiply the sum signal y[n] with a coefficient K. From FIG. 10, it can be derived that $$\hat{v}[n]=\hat{v}[n-1]+K \cdot y[n] \qquad (4)$$

Comparing with Eq. 3, it can be observed that the accumulator depicted in FIG. 10, which has a digital output, mimics the integrator 90 (FIG. 6), which has an analog output. Either $\hat{v}[n]$ or $\hat{v}[n-1]$ may be used as the output from the accumulator in FIG. 10. It should be noted that k in Eq. 3 is a gain factor from the dimensionless digital domain to the analog domain, which typically has the dimension voltage (as in the embodiment in FIG. 7 where v[n] corresponds to $V_{ref}$), current, or electrical charge. K in Eq. 4, on the other hand, is a gain factor from the dimensionless digital domain to the dimensionless digital domain. Hence, k and K are not of the same dimension. If $\hat{v}[n]$ (or $\hat{v}[n-1]$) is used as the output z[n], the value of K can be selected relatively arbitrarily. In some embodiments, K can be selected to 1, whereby the coefficient multiplier circuit 180 can be omitted.

Other filter circuits 150 than an accumulator, that more or less well approximates the behavior of an accumulator, may be used as well, depending on the requirements for a given application in which the ADC circuit 50 is to be used.

In some embodiments, an estimate of the signal s[n] (FIG. 6) is used as the output signal z[n]. In the following, this estimate is denoted $\hat{s}[n]$. In some embodiments, $\hat{s}[n]$ is a sum of a signal $\hat{e}[n]$ and $\hat{v}[n]$. The signal $\hat{e}[n]$ may be an estimate of the difference signal e[n] (FIG. 6). In other words, $$\hat{s}[n]=\hat{v}[n]+\hat{e}[n] \qquad (5)$$

Comparing with Eq. 1, it is readily seen that this is a reasonable estimation of s[n]. In some embodiments, the digital output circuit comprises a mapping circuit 190 configured to generate $\hat{e}[n]$ in response to the sum signal y[n] as $\hat{e}[n]=cdf^{-1}(y[n+1])$. Since, $\hat{e}[n]$ is generated as a mapping of the sum signal $\hat{y}[n+1]$, $\hat{e}[n]$ is also referred to herein as a "mapped sum signal". At a first glance, it may appear strange that $\hat{e}[n]$ is generated based on a "future" value of y[n], i.e. y[n+1]. However, this reflects the fact that y[n] is generated (by the comparator circuits $70_j$) based on a previous value of e[n] (see Eq. 2), and is easily realized in the digital domain by appropriately inserting a delay in the digital processing paths. An alternative formulation is $\hat{e}[n-1]=cdf^{-1}(y[n])$. The mapping function $cdf^{-1}(\bullet)$ is an inverse of a monotone nonlinear mapping $cdf(\bullet)$. The mapping $cdf(\bullet)$ may be an estimate of the cumulative distribution function $CDF(\bullet)$ (Eq. 2) of the comparator circuits' offsets. The mapping circuit 190 can e.g. be implemented as a look-up table.

Figure 11:
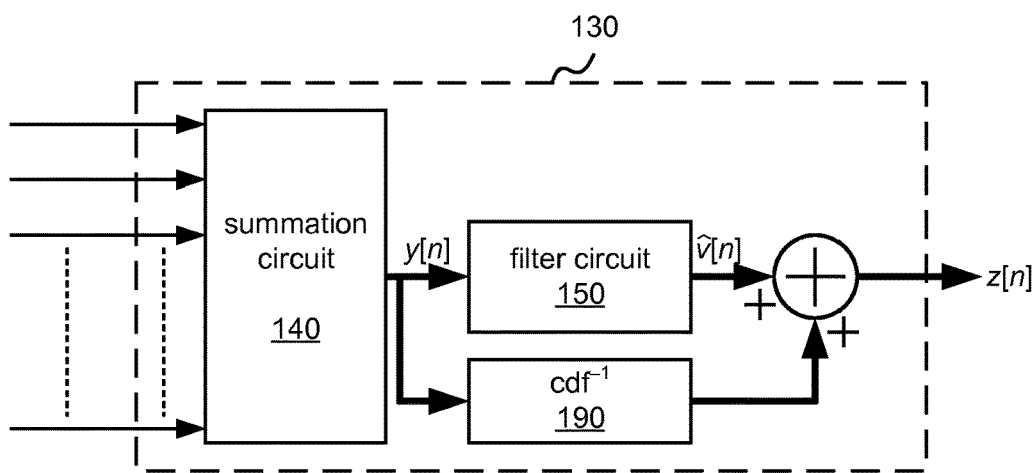
FIG. 11 is a block diagram of an embodiment of a digital output circuit.

FIG. 11 is a block diagram of an embodiment of the digital output circuit 130 configured to operate according to the description above. It can be noted that, if the filter circuit 150 is implemented as in FIG. 10, using $\hat{v}[n-1]$ rather than $\hat{v}[n]$ as the output from the filter circuit 150 can provide the "appropriately inserted delay" mentioned in the preceding paragraph.

Figure 12:
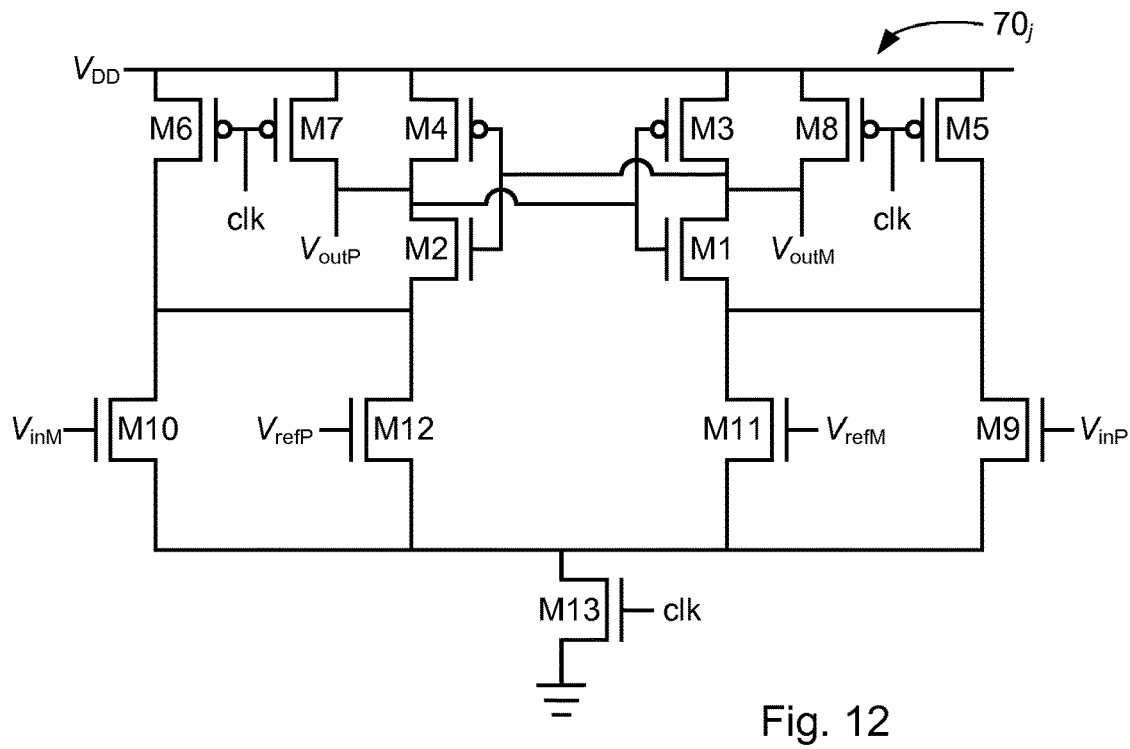
FIG. 12 is a schematic circuit diagram of a comparator circuit.

FIG. 12 is a schematic circuit diagram of the comparator circuit $70_j$ according to an embodiment. Each of the comparator circuits $70_1$-$70_N$ may be implemented in the same way. The embodiment illustrated in FIG. 12 has a differential implementation where the input voltage $V_{in}$ is formed by a first component $V_{inP}$ and a second component $V_{inM}$, where $V_{in}=V_{inP}-V_{inM}$. Likewise, $V_{ref}$ is formed by a first component $V_{refP}$ and a second component $V_{refM}$, where $V_{ref}=V_{refP}-V_{refM}$. Furthermore, embodiment illustrated in FIG. 12 has a differential output where an output voltage $V_{out}$ is formed by a first component $V_{outP}$ and a second component $V_{outM}$, where $V_{out}=V_{outP}-V_{outM}$.

In the embodiment illustrated in FIG. 12, the comparator circuit $70_j$ comprises two cross-coupled pairs of transistors, namely a pair of NMOS transistors M1 and M2, and a pair of PMOS transistors M3 and M4. The source terminals of M3 and M4 are connected to a supply voltage $V_{DD}$. The drain terminals of M1 and M3 are interconnected, and the drain terminals of M2 and M4 are interconnected. The comparator circuit $70_j$ according to the embodiment illustrated in FIG. 12 is configured to generate $V_{outP}$ at the drain terminals of M2 and M4 (in the following referred to as "the output $V_{outP}$"), and to generate $V_{outM}$ at the drain terminals of M1 and M3 (in the following referred to as "the output $V_{outM}$"). The gate terminals of M1 and M3 are both connected to the interconnected drain terminals of M2 and M4, and the gate terminals of M2 and M4 are both connected to the interconnected drain terminals of M1 and M3. The embodiment of the comparator circuit $70_j$ illustrated in FIG. 12 further comprises clocked PMOS transistors M5, M6, M7, and M8. Each of these transistors M5-M8 has its source terminal connected to $V_{DD}$ and its gate terminal connected to a clock input to receive the clock signal clk. The drain terminal of M5 is connected to the source terminal of M1. The drain terminal of M6 is connected to the source terminal of M2. The drain terminal of M7 is connected to the drain terminals of M2 and M4. The drain terminal of M8 is connected to the drain terminals of M1 and M3. The embodiment of the comparator circuit $70_j$ illustrated in FIG. 12 further comprises NMOS transistors M9, M10, M11, and M12. These NMOS transistors M9-M12 are used as input transistors of the comparator circuit $70_j$. The gate terminal of M9 is configured to receive $V_{inP}$. The gate terminal of M10 is configured to receive $V_{inM}$. The gate terminals of M9 and M10 are terminals of the above-mentioned first input (which in this case is a differential input having two terminals) of the comparator circuit $70_j$. The gate terminal of M11 is configured to receive $V_{refM}$. The gate terminal of M12 is configured to receive $V_{refP}$. The gate terminals of M11 and M12 are terminals of the above-mentioned second input (which in this case is a differential input having two terminals) of the comparator circuit $70_j$. The source terminals of all of M9-M12 are interconnected. The drain terminals of M9 and M11 are both connected to the source terminal of M1. The drain terminals of M10 and M12 are both connected to the source terminal of M2. Furthermore, the embodiment of the comparator circuit $70_j$ illustrated in FIG. 12 comprises a clocked NMOS transistor M13. The source terminal of M13 is connected to ground. The drain terminal of M13 is connected to the interconnected source terminals of M9-M12. The gate terminal of M13 is connected to the clock input to receive the clock signal clk.

When the clock signal clk is "low", M13 is switched off and M5-M8 are switched on. This causes the outputs $V_{outP}$ and $V_{outM}$ and the source terminals of M1 and M2 to be precharged to $V_{DD}$. When the clock signal clk goes "high", M5-M8 are switched off, and M13 is switched on, and a difference between $V_{outP}$ and $V_{outM}$ is enabled to develop depending in $V_{in}$ and $V_{ref}$. This developing difference between $V_{outP}$ and $V_{outM}$ is enhanced by the positive feedback loop provided by the cross-coupled pairs M1-M2 and M3-M4, which provides a relatively short decision time for the comparator circuit $70_j$. If $V_{in} > V_{ref} + V_{os}(j)$, where $V_{os}(j)$ is the offset voltage of comparator $70_j$, then $V_{outP}$ will settle at a high value ($V_{DD}$) and $V_{outM}$ will settle at a low value (0). Similarly, if $V_{in} < V_{ref} + V_{os}(j)$, then $V_{outP}$ will settle at a low value (0) and $V_{outM}$ will settle at a high value ($V_{DD}$). As a design guideline, the circuit designer should be aware that a difference between the common-mode levels of the differential signals $V_{in}$ and $V_{ref}$ might influence the accuracy of the comparator circuit $70_j$. Circuit simulations could be used to determine how much common-mode level difference can be handled for a given implementation.

It should be noted that the embodiment of the comparator circuit $70_j$ illustrated in FIG. 12 is merely an example, and many other circuit topologies with similar functionality may be used. For instance, a isolation gain stage, such as a common-drain amplifier, can be inserted at the gate of each of M9 and M10 to reduce clock-signal feed-through to the input of the comparator circuit $70_j$. Furthermore, it should be noted that a complementary version of the circuit shown in FIG. 12 may also be used, where all NMOS transistors are replaced with PMOS transistors, and vice versa, and all connections to $V_{DD}$ are replaced with connections to ground, and vice versa.

Figure 13:
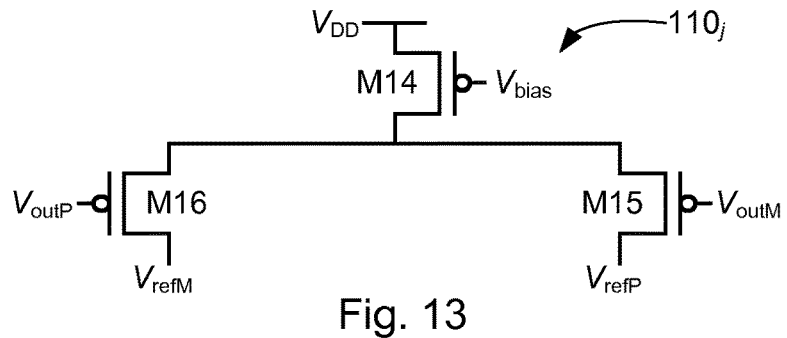
FIG. 13 is a schematic circuit diagram of a one-bit DAC circuit.

FIG. 13 is a schematic circuit diagram of the IDAC $110_j$. Each of the IDACs $110_1$-$110_N$ may be implemented in the same way. The embodiment of the IDAC $110_j$ illustrated in FIG. 13 comprises a PMOS transistor M14. M14 is configured to operate as a current source. The gate terminal of M14 is biased with a voltage $V_{bias}$. The source terminal of M14 is connected to $V_{DD}$. The drain terminal of M14 is connected to the source terminals of PMOS transistors M15 and M16. M15 and M16 are configured to operate as switches. The gate terminal of M15 is controlled by $V_{outM}$ from the comparator $70_j$. The gate terminal of M16 is controlled by $V_{outP}$ from the comparator $70_j$. The drain terminal of M16 is connected to the $V_{refM}$ input of the comparator circuit $70_j$. For the embodiment in FIG. 12, this is the gate terminal of M11. The drain terminal of M15 is connected to the $V_{refP}$ input of the comparator circuit $70_j$. For the embodiment in FIG. 12, this is the gate terminal of M12.

In the following functional description, it is assumed that the IDAC $110_1$ is operating together with the embodiment of the comparator circuit $70_j$ shown in FIG. 12, or a comparator circuit with the same functionality. When the clock signal clk is "low", $V_{outP}$ and $V_{outM}$ are both "high", so both M15 and M16 are switched off. When the clock signal clk goes "high", either $V_{outP}$ or $V_{outM}$ will go "low", whereby either M16 (if $V_{outP}$ goes "low") or M15 (if $V_{outM}$ goes low) is switched on, and directs the drain current from M14 to either the gate terminal of M11 (if M16 is switched on) or the gate terminal of M12 (if M15 is switched on).

It should be noted that the embodiment of the IDAC $110_j$ illustrated in FIG. 13 is merely an example, and many other circuit topologies with similar functionality may be used, for instance using one or more cascode transistors in the current source. Furthermore, it should be noted that a complementary version of the circuit shown in FIG. 13 may also be used (for instance, together with the above-mentioned complementary version of the circuit in FIG. 12), where the PMOS transistors are replaced with NMOS transistors, the connection to $V_{DD}$ is replaced with a connection to ground.

Figure 14:
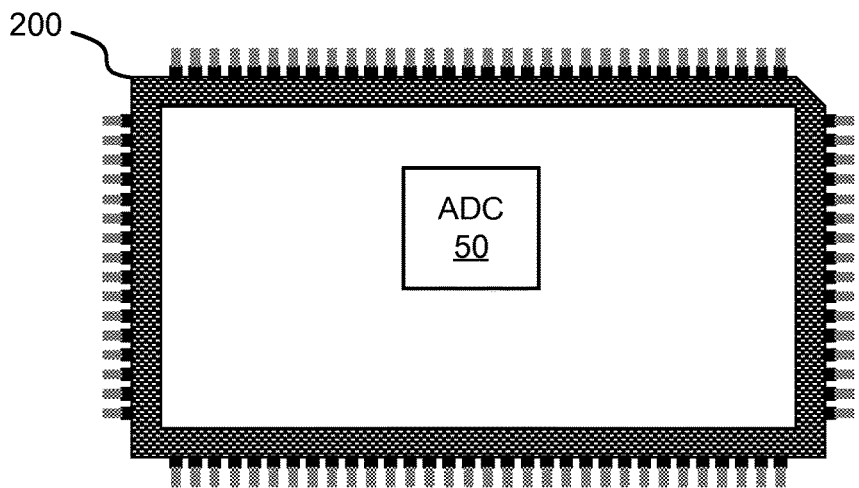
FIG. 14 illustrates an integrated circuit.

Embodiments of the ADC circuit 50 described herein are suitable for integration in an integrated circuit. FIG. 14 illustrates an integrated circuit 200 comprising an embodiment of the ADC circuit 50. For instance, the integrated circuit 200 may comprise the transceiver circuit 10, or parts thereof that includes the ADC circuit 50.

The disclosure above refers to specific embodiments. However, other embodiments than the above described are possible within the scope of the invention. For example, the ADC circuit 50 may be used in other types of electronic apparatuses than communication apparatuses. The different features and steps of the embodiments may be combined in other combinations than those described.

The invention claimed is:

1. An analog-to-digital converter (ADC) circuit, comprising:
   a global input configured to receive an input voltage;
   a plurality of converter circuits, wherein each converter circuit (105j) comprises:
      a comparator circuit having a first input connected to the global input, a second input, and an output configured to output a one-bit output signal of the comparator circuit; and
      a one-bit current-output digital-to-analog converter (DAC) having an input directly controlled from the output of the comparator circuit and an output connected to the second input of the comparator circuit;
   wherein the second inputs of all comparator circuits are interconnected; and
   wherein the ADC circuit comprises a digital output circuit configured to generate an output signal of the ADC circuit in response to the one-bit output signals of the comparator circuits.

2. The ADC circuit of claim 1, wherein the ADC circuit comprises a capacitor circuit connected to the interconnected second inputs of the comparator circuits.

3. The ADC circuit of claim 1, wherein the second inputs of the comparator circuits are formed by gate terminals of field-effect transistors.

4. The ADC circuit of claim 1, wherein the comparator circuit is a clocked comparator circuit configured to update the output signal of the comparator circuit periodically in response to a clock signal.

5. The ADC circuit of claim 1, wherein the digital output circuit comprises a digital summation circuit configured to generate a sum signal y[n] as a sum of the one-bit output signals from the comparator circuits.

6. The ADC circuit of claim 5, wherein the digital output circuit comprises a filter circuit configured to generate a filtered sum signal by filtering the sum signal.

7. The ADC circuit of claim 6, wherein the filter circuit is an accumulator.

8. The ADC circuit of claim 6, wherein the filtered sum signal is the output signal of the ADC circuit.

9. The ADC circuit of claim 8, wherein the digital output circuit comprises a mapping circuit configured to generate a mapped sum signal ê[n] in response to the sum signal y[n] as ê[n]=cdf$^{-1}$(y[n+1]), where cdf$^{-1}$(•) in an inverse of a monotone nonlinear mapping cdf(•).

10. The ADC circuit of claim 9, wherein a sum of the mapped sum signal ê[n] and the filtered sum signal is the output signal of the ADC circuit.

11. An integrated circuit, comprising:
an analog-to-digital converter (ADC) circuit, the ADC circuit comprising:
a global input configured to receive an input voltage;
a plurality of converter circuits, wherein each converter circuit (105j) comprises:
a comparator circuit having a first input connected to the global input, a second input, and an output configured to output a one-bit output signal of the comparator circuit; and
a one-bit current-output digital-to-analog converter (DAC) having an input directly controlled from the output of the comparator circuit and an output connected to the second input of the comparator circuit;
wherein the second inputs of all comparator circuits are interconnected; and
wherein the ADC circuit comprises a digital output circuit configured to generate an output signal of the ADC circuit in response to the one-bit output signals of the comparator circuits.

12. An electronic apparatus, comprising:
an analog-to-digital converter (ADC) circuit, the ADC circuit comprising:
a global input configured to receive an input voltage;
a plurality of converter circuits, wherein each converter circuit (105j) comprises:
a comparator circuit having a first input connected to the global input, a second input, and an output configured to output a one-bit output signal of the comparator circuit; and
a one-bit current-output digital-to-analog converter (DAC) having an input directly controlled from the output of the comparator circuit and an output connected to the second input of the comparator circuit;
wherein the second inputs of all comparator circuits are interconnected; and
wherein the ADC circuit comprises a digital output circuit configured to generate an output signal of the ADC circuit in response to the one-bit output signals of the comparator circuits.

13. The electronic apparatus circuit of claim 12, wherein the ADC circuit comprises a capacitor circuit connected to the interconnected second inputs of the comparator circuits.

14. The electronic apparatus circuit of claim 12, wherein the second inputs of the comparator circuits are formed by gate terminals of field-effect transistors.

15. The electronic apparatus circuit of claim 12, wherein the comparator circuit is a clocked comparator circuit configured to update the output signal of the comparator circuit periodically in response to a clock signal.

16. The electronic apparatus circuit of claim 12, wherein the digital output circuit comprises a digital summation circuit configured to generate a sum signal y[n] as a sum of the one-bit output signals from the comparator circuits.

17. The electronic apparatus circuit of claim 12:
wherein the digital output circuit comprises a filter circuit configured to generate a filtered sum signal by filtering the sum signal; and
wherein the filtered sum signal is the output signal of the ADC circuit.

18. The electronic apparatus of claim 12, wherein the electronic apparatus is a communication apparatus.

19. The electronic apparatus of claim 18, wherein the communication apparatus is a wireless communication device for a cellular communications system.

20. The electronic apparatus of claim 18, wherein the communication apparatus is a base station for a cellular communications system.

* * * * *